United States Patent
Knapp

(10) Patent No.: US 7,454,556 B1
(45) Date of Patent: Nov. 18, 2008

(54) METHOD TO PROGRAM NON-JTAG ATTACHED DEVICES OR MEMORIES USING A PLD AND ITS ASSOCIATED JTAG INTERFACE

(75) Inventor: Steven K. Knapp, Soquel, CA (US)

(73) Assignee: Xilinx, Inc., San Jose, CA (US)

( * ) Notice: Subject to any disclaimer, the term of this patent is extended or adjusted under 35 U.S.C. 154(b) by 508 days.

(21) Appl. No.: 11/049,178

(22) Filed: Feb. 2, 2005

(51) Int. Cl.
H03K 19/173 (2006.01)

(52) U.S. Cl. .................... 711/101; 711/103; 326/37; 326/38

(58) Field of Classification Search ............ 326/37, 326/38; 711/101, 103
See application file for complete search history.

(56) References Cited

U.S. PATENT DOCUMENTS

| | | | |
|---|---|---|---|
| 5,635,855 A | 6/1997 | Tang | |
| 5,999,014 A | 12/1999 | Jacobson et al. | |
| 6,044,025 A * | 3/2000 | Lawman | 365/191 |
| 6,097,211 A * | 8/2000 | Couts-Martin et al. | 326/40 |
| 6,102,963 A | 8/2000 | Agrawal | |
| 6,259,271 B1 | 7/2001 | Couts-Martin et al. | |
| 6,336,209 B1 | 1/2002 | Nishihara et al. | |
| 6,714,040 B1 | 3/2004 | Jacobson et al. | |
| 6,898,776 B1 | 5/2005 | Jacobson et al. | |
| 7,023,239 B1 | 4/2006 | Jacobson et al. | |
| 7,047,467 B1 | 5/2006 | Khu et al. | |
| 2006/0038586 A1* | 2/2006 | Xia et al. | 326/39 |

OTHER PUBLICATIONS

U.S. Appl. No. 10/810,032, filed Mar. 26, 2004, Knapp.
U.S. Appl. No. 10/043,637, filed Jan. 9, 2002, Khu et al.
The Institute of Electrical and Electronics Engineers, Inc.; "IEEE Standard for In-System Configuration of Programmable Devices", IEEE Std. 1532-2002, Jan. 10, 2003, pp. 1-141, available from IEEE, 3 Park Avenue, New York, NY 10016-5997.
The Institute of Electrical and Electronics Engineers, Inc.; "IEEE Standard Test Access Port and Boundary-Scan Architecture", IEEE Std 1149.1-1990, Feb. 17, 1993, pp. 1-127, available from IEEE, 3 Park Avenue, New York, NY 10016-5997.
Xilinx, Inc.; U.S. Appl. No. 10/606,728 by Bridgford on Jun. 26, 2003.
Xilinx, Inc.; U.S. Appl. No. 10/955,807 by Jacobson on Sep. 29, 2004.
Rick Folea; "Programming Flash Memory from FPGAs and CPLDs Using the JTAG Port"; Xilinx Xcell Journal; Summer 2004; pp. 1-3.
Kris Chaplin; "Reconfiguring Block RAMs—Part 1 and Part 2"; Jul. 17, 2003; downloaded from http://www.xilinx.com/xlnx/xweb/xil_tx_display.jsp?sTechX_ID=rs_blockRAM; pp. 1-9.

* cited by examiner

*Primary Examiner*—Hyung Sough
*Assistant Examiner*—Kenneth M Lo
(74) *Attorney, Agent, or Firm*—Thomas A. Ward; LeRoy D. Maunu

(57) ABSTRACT

A method is provided to program a memory device through a JTAG interface of an attached component with programmable logic, wherein the memory device does not have a JTAG interface. Initially, programming hardware to provide for programming of the attached memory is downloaded into the component via the component's JTAG interface. The programmed component then becomes a serial data link between the JTAG port attached to a host programmer and a non-JTAG port attached to the memory device. The circuitry downloaded or programmed into the component controls the timing and the protocol to program the external memory.

20 Claims, 4 Drawing Sheets

METHOD TO PROGRAM NON-JTAG ATTACHED DEVICES OR MEMORIES USING A PLD AND ITS ASSOCIATED JTAG INTERFACE

BACKGROUND

1. Technical Field

The present invention relates to programming a memory device not having a Joint Test Action Group (JTAG) port through a component having a JTAG interface.

2. Related Art

A configuration memory internal to a Programmable Logic Device (PLD) is typically programmed through a PLD's JTAG port. JTAG is a four-wire interface primarily used for system testing and debugging, but the JTAG interface is also commonly used as a programming interface for Field Programmable Gate Arrays (FPGAs), Complex PLDs (CPLDs), and some microcontrollers, processors, and digital signal processors (DSPs.). Two defining specifications for JTAG are IEEE 1149.1 and IEEE 1532.

PLDs are typically used on a Printed Circuit Board (PCB) to enable programming or instantiating various components on the PCB. The first prototype PCB, however, poses a problem—how to load the first code, such as boot up code into an external memory attached to the PLD. The external memory can be preprogrammed before populating the PCB, but that assumes the code is ready in time and will not require changes.

As one answer, some PLD manufacturers make external memory devices for storing the PLD configuration data that include a dedicated JTAG port as a programming interface connection to the PLD. One such manufacturer is Xilinx, Inc. of San Jose, Calif. which provides a Programmable Read Only Memory (PROM) with a JTAG programming port. Most commodity memories such as flash and DDR SDRAM are not typically used as configuration memories for PLDs, and do not have a JTAG interface or a JTAG programming infrastructure, including JTAG programming hardware and associated software to enable programming. With advances in FPGAs and other PLDs, however, commodity memory devices such as byte-wide parallel flash and Serial Peripheral Interface (SPI) flash that do not have a JTAG port may be used to store an FPGA's configuration program.

Another answer to programming an external configuration storage memory that does not have a dedicated JTAG is described with reference to the components of FIG. 1. The method uses the JTAG interface 4 of a component 2, such as a PLD, and a separate non-JTAG communication port 6 to connect and communicate with the attached memory device 8. The method uses the JTAG interface components, including the Boundary Scan Chain (BSC) elements 10 and JTAG port 7 of the component 2 as a serial interface between the JTAG interface 4 and the non-JTAG interface 6; the method avoids programming or instantiating hardware into the component 2. Data is provided serially between the primary Test Data Input (TDI) pin and the primary Test Data Output (TDO) pin of the JTAG access port 7. The Test Access Port (TAP) controls data flow and receives JTAG control signals from the Test Mode Select (TMS) and Test Clock (TCK) inputs. This method of providing a serial interface between a JTAG and non-JTAG port uses the JTAG EXTEST instruction and sometimes the SAMPLE/PRELOAD instruction to control the boundary scan chain, and is therefore referred to herein as a JTAG EXTEST method.

The JTAG EXTEST instruction controls the logic value that appears on each of the I/O pins 12 of the component 2. The logic values are shifted into the component 2 using the four-wire JTAG interface 4. Data must be shifted into all input/output (I/O) pin locations 12 for every new I/O vector applied. In other words, to toggle a single output pin requires writing values and shifting them into all the I/O locations, potentially requiring hundreds of JTAG clock cycles to transfer a complete set of data. To monitor logic values applied to one of the I/O pins, the data can be shifted back through the JTAG boundary scan chain.

The JTAG EXTEST method offers the advantage of a low cost alternative for programming an attached memory device, since all required logic is already part of the basic JTAG support. A disadvantage of the JTAG EXTEST method, however, is that bandwidth is limited because all I/O control bits must be written into by serially shifting in all pin data, even if only a single output needs changing, making programming relatively slow. A further disadvantage to programming using the JTAG EXTEXT method is that the programming procedure is somewhat complex. To write data to the attached memory 8, software in the host programmer 14 attached to the JTAG interface port 4 will typically need to convert the data into multiple vectors and map the vectors to the appropriate positions in the JTAG boundary scan 10. Similarly, any logic values read from I/O pins must be extracted through the JTAG boundary scan chain 10 to scan-out data.

It would be desirable to provide a method for programming an external configuration memory device that does not have a JTAG interface through the JTAG interface of a component without experiencing the disadvantages of the JTAG EXTEST method.

SUMMARY

Embodiments of the present invention include a method to program a memory device through a JTAG interface of a component, such as a PLD, e.g., an FPGA or CPLD, a processor, or a DSP, even through the attached memory device does not itself have a JTAG interface, without experiencing the drawbacks of using the JTAG EXTEST method.

Programming of the memory device is accomplished by first programming hardware into the component with a JTAG interface to enable programming of the attached memory. The component with a JTAG interface then becomes a serial data link between an external source of programming data and the memory device. The circuitry programmed or downloaded into the component with a JTAG interface in one embodiment then controls the timing and the protocol to program the external memory.

In one embodiment, the external memory device programmed using the FPGA's JTAG interface is the configuration storage memory used for storing configuration data to configure the FPGA. Thus, in operation a FPGA first has its internal configuration memory programmed using its JTAG port so that it forms programming hardware to enable programming of the attached configuration memory. The memory is then programmed by storing data provided through the JTAG port using the programming hardware instantiated into the FPGA. After the memory device is programmed using the FPGA's JTAG interface, the FPGA is then forced to re-configure and obtains its new program from the memory device.

In other embodiments of the present invention, the method can be generalized to support communication to practically any device containing programmable memory or addressable registers attached to the FPGA using the FPGA's JTAG interface. For example, an attached Double Data Rate (DDR) SDRAM memory is used to store instructions for a processor, such as the MicroBlaze soft processor core embedded in an FPGA manufactured by Xilinx, or for another microprocessor or DSP with external memory. Instructions can be preloaded into the DDR SDRAM via the JTAG interface even though the memory does not have a JTAG interface. As one implementation of an embodiment of the present invention, an external commodity memory device such as byte-wide parallel flash memory or SPI flash memory can be programmed via JTAG despite that neither has a JTAG interface.

BRIEF DESCRIPTION OF THE DRAWINGS

Further details of the present invention are explained with the help of the attached drawings in which.

DETAILED DESCRIPTION

Figure 1:
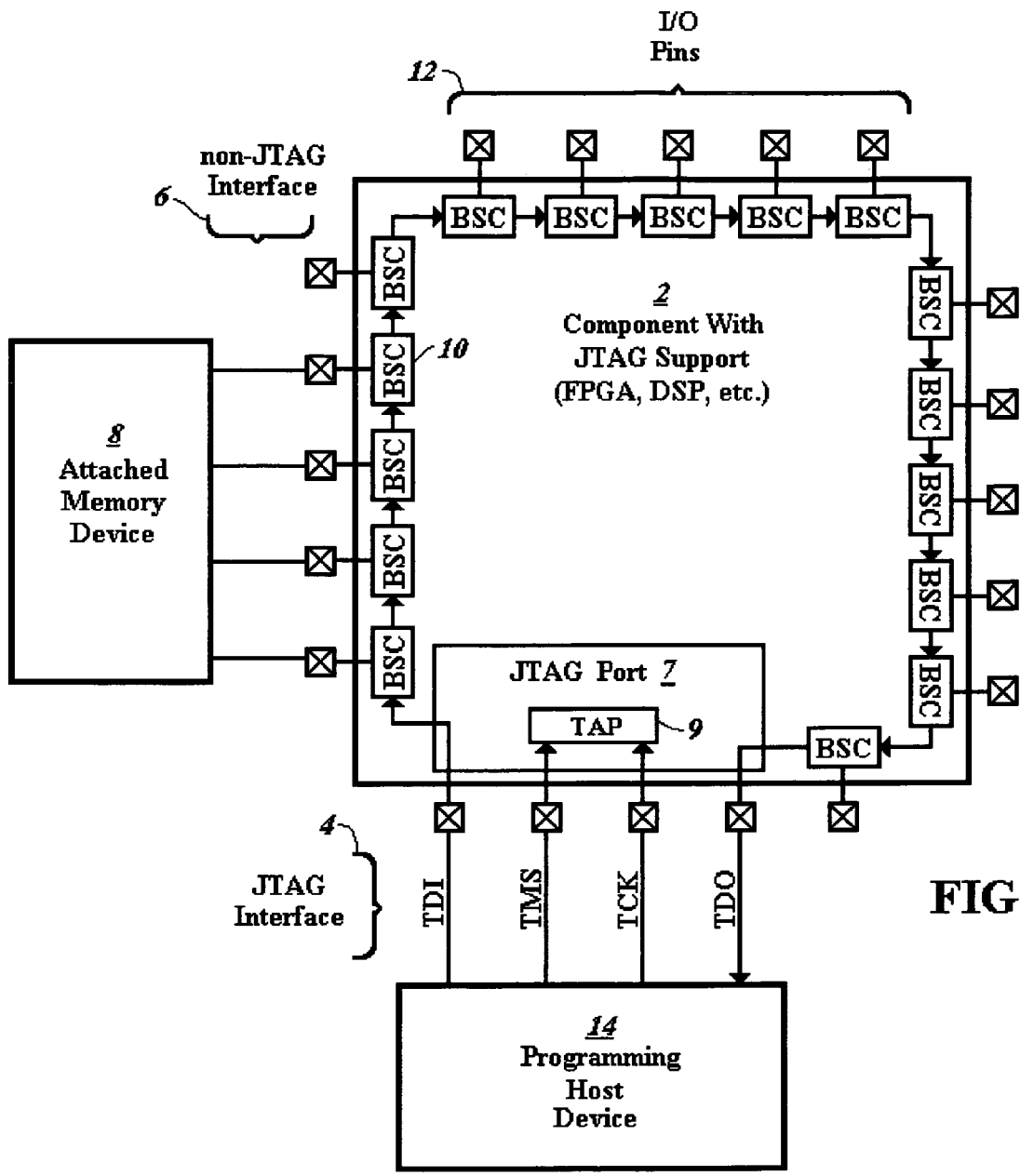
FIG. 1 shows a configuration of components to illustrate conventional programming of an external memory that does not have a dedicated JTAG port through a component having a JTAG interface.
Figure 2:
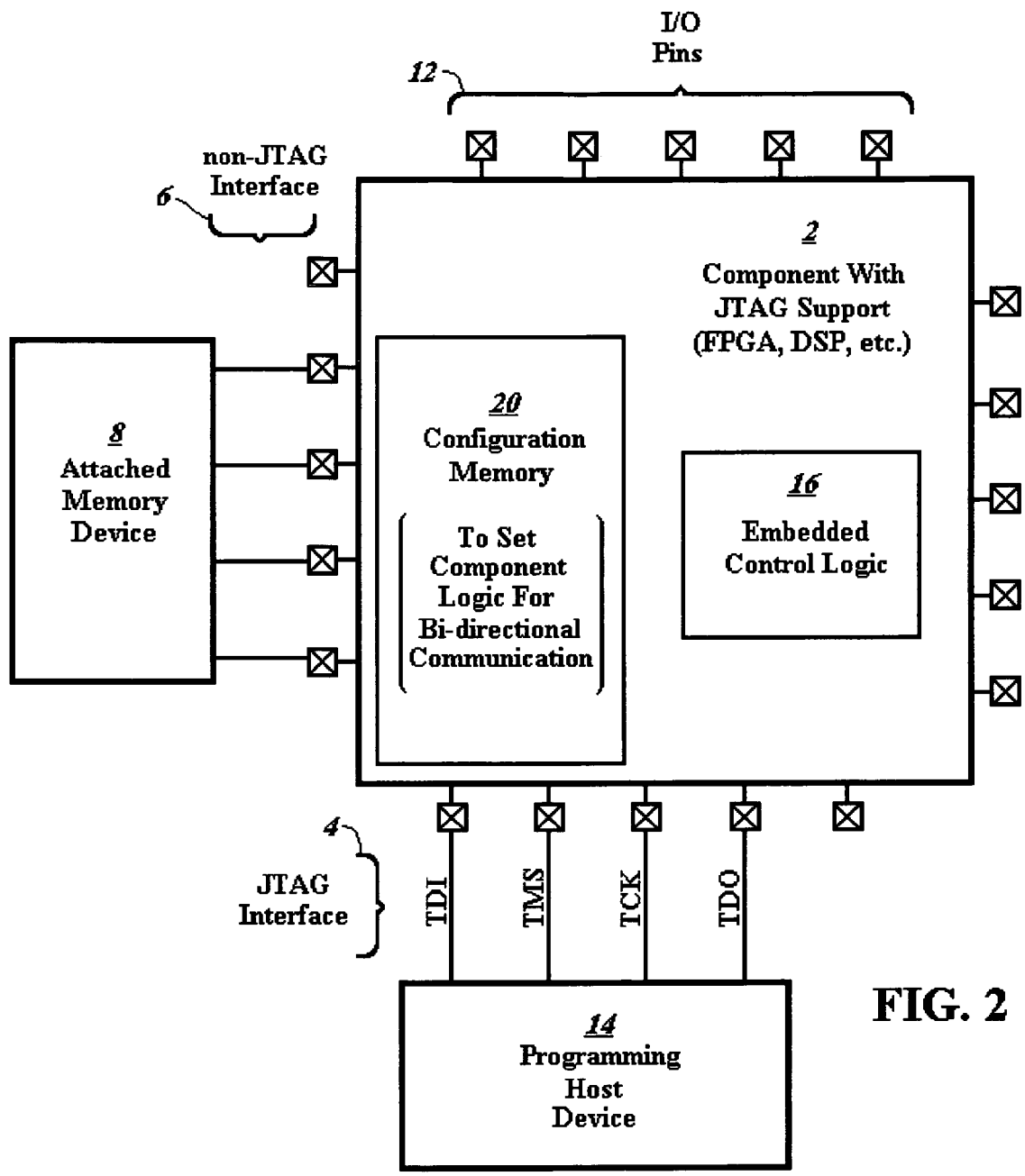
FIG. 2 illustrates a configuration of components for programming a memory through a device with a JTAG interface according to embodiments of the present invention.

FIG. 2 illustrates a configuration of components for programming a memory through a device with a JTAG interface according to embodiments of the present invention. For convenience, components carried over from FIG. 1 to FIG. 2 are similarly labeled, as will be components carried over in subsequent drawings. The components include a component 2 with a JTAG interface 4, a memory device 8 and a programming host 14. Although a number of different types of devices with a JTAG interface can be used for component 2 in FIG. 2, including FPGAs, microprocessors, DSPs, PLDs or other devices with in-system programmable (ISP) logic, the following description herein will refer to an FPGA. Using the components shown in FIG. 2, a configuration image is downloaded (programmed or instantiated) into the configuration memory 20 of the FPGA 2 via the FPGA's JTAG interface 4 to configure the FPGA 2. The new configuration image downloaded into the configuration memory 20 contains control logic for programming the attached memory device 8. This control logic programmed into the FPGA 2 can be as simple as a state-machine or something more complex, such as the MicroBlaze™ processor softcore sold by Xilinx, Corp. of San Jose, Calif. The control logic programmed into the FPGA 2 is configured to form a communication device based on components and protocols required for the particular memory device 8. It is desirable that the programming logic must fit within the available logic resources of the FPGA 2.

In one embodiment, the configuration memory 20 of the FPGA 2 is programmed to form a bi-directional serial communications interface between the memory device 8, the embedded control logic 16, and the external host 14. The programming host 14—such as a personal computer, workstation, JTAG test controller, or even a separate microcontroller or DSP on the board—connects to the FPGA's JTAG interface 4. Software running on the intelligent programming host 14 interacts with the programming control logic of the FPGA 2 to enable programming of its configuration memory 20. Depending on the specific application, the host-based software may query the attached memory device 8 to determine its type and capabilities. Once identified, the host-based controller 14 applies the appropriate programming algorithm in the configuration memory 20 of the FPGA 2. Note different programming algorithms may be instantiated into the FPGA 2 depending on the hardware and software requirements for programming the particular memory device 8. The actual programming data is transferred from the host-based controller 14 to the attached memory device 8 through the JTAG interface 4 and non-JTAG interface 6 using communications logic now programmed into the FPGA 2. Once the attached memory device 8 is programmed, either the programmer now in the configuration memory 20 of the FPGA 2, or the external controller 14 may force the FPGA 2 to reconfigure its configuration memory 20 from the newly-written attached memory device 8.

This method, referred to as the FPGA programming approach, can offer several advantages over the JTAG EXTEST approach. First, it will typically reduce data bandwidth requirements, and thus overall programming time for the memory device, especially for storing large data sets. Bandwidth and programming time are reduced because to change data on a single I/O pin, data does not have to be serially shifted around the boundary scan chain. Additionally, logistics involved in programming or storing data into a memory device are reduced. In particular, logistics allow programming data to remain in its original form rather than being converted into large JTAG-specific vector files.

The FPGA programming approach offers the advantage of being applicable to a variety of attached devices such as parallel flash, serial flash, DDR SDRAM, etc. The FPGA programming approach does not obsolete the JTAG EXTEST boundary approach. The JTAG EXTEST boundary scan chain still exists and still supports legacy applications. The FPGA programming approach is a low cost solution in that no additional resources are required for programming, and the existing resources are used efficiently. The FPGA programming approach requires some development effort to create initial FPGA programming designs, but these designs can be generalized by using components, such as an embedded control logic 16 (which may be a processor such as the Xilinx MicroBlaze), to make programming efficient.

Although it appears the FPGA programming approach would require significantly more time for writing data to a memory device, due to the programming process, than the JTAG EXTEST method which does not require programming, the increase in bandwidth actually makes up for the added programming time. As indicated previously, the JTAG EXTEST method requires writing the entire EXTEST chain to change one or all the I/O pin values or to read values applied to one or all the I/O pins. For example, the Spartan-3 XC3S50, manufactured by Xilinx, has 124 total I/O pins. Assuming that each I/O pin has three JTAG cells—one each for input, output, and output enable—then 372 JTAG TCK clock cycles are required to update the entire EXTEST chain. For programming an FPGA using the FPGA programming approach in one example, approximately 439,264 JTAG TCK clock cycles are required to program the FPGA. During the same number of clock cycles, the JTAG EXTEST method could issue 1,181 vectors. Even if writing an attached byte-wide flash, the 1,181 JTAG TCK clock cycles would update only a small fraction of the attached memory. Consequently, the proposed method would require fewer JTAG clock cycles and would improve the bandwidth over the JTAG interface.

EXAMPLES

Specifics of two embodiments of the present invention are described in examples to follow. A first example describes programming of an attached flash memory using a SPI communication protocol, while a second example describes programming of an attached commodity parallel flash memory.

I. SPI Flash

With a logic component having a JTAG interface and an SPI port, the SPI flash memory can be programmed using a JTAG interface even though the device does not have a JTAG interface. SPI flash memories are typically available in very low-cost 8-pin packages and do not include a JTAG interface. One such component with programmable logic having a dedicated SPI flash configuration mode that is capable of interfacing with SPI flash is described in U.S. patent application Ser. No. 10/810,032, filed Mar. 26, 2004, by Steven K. Knapp.

There are various methods to program SPI flash memory in a production environment. In a first method, the SPI flash is programmed before assembly, assuming that the memory never needs to be updated. In a second method, the FPGA I/Os connected to the four-wire SPI flash are tri-stated and the SPI is programmed using a separate circuit device dedicated to program the SPI flash. In a third method, the SPI flash is programmed using an FPGA's JTAG interface using the traditional JTAG EXTEST method. In a fourth method, the FPGA programming approach described herein is applied by downloading an FPGA-based SPI flash programmer into the configuration memory via the FPGA's JTAG interface.

Figure 3:
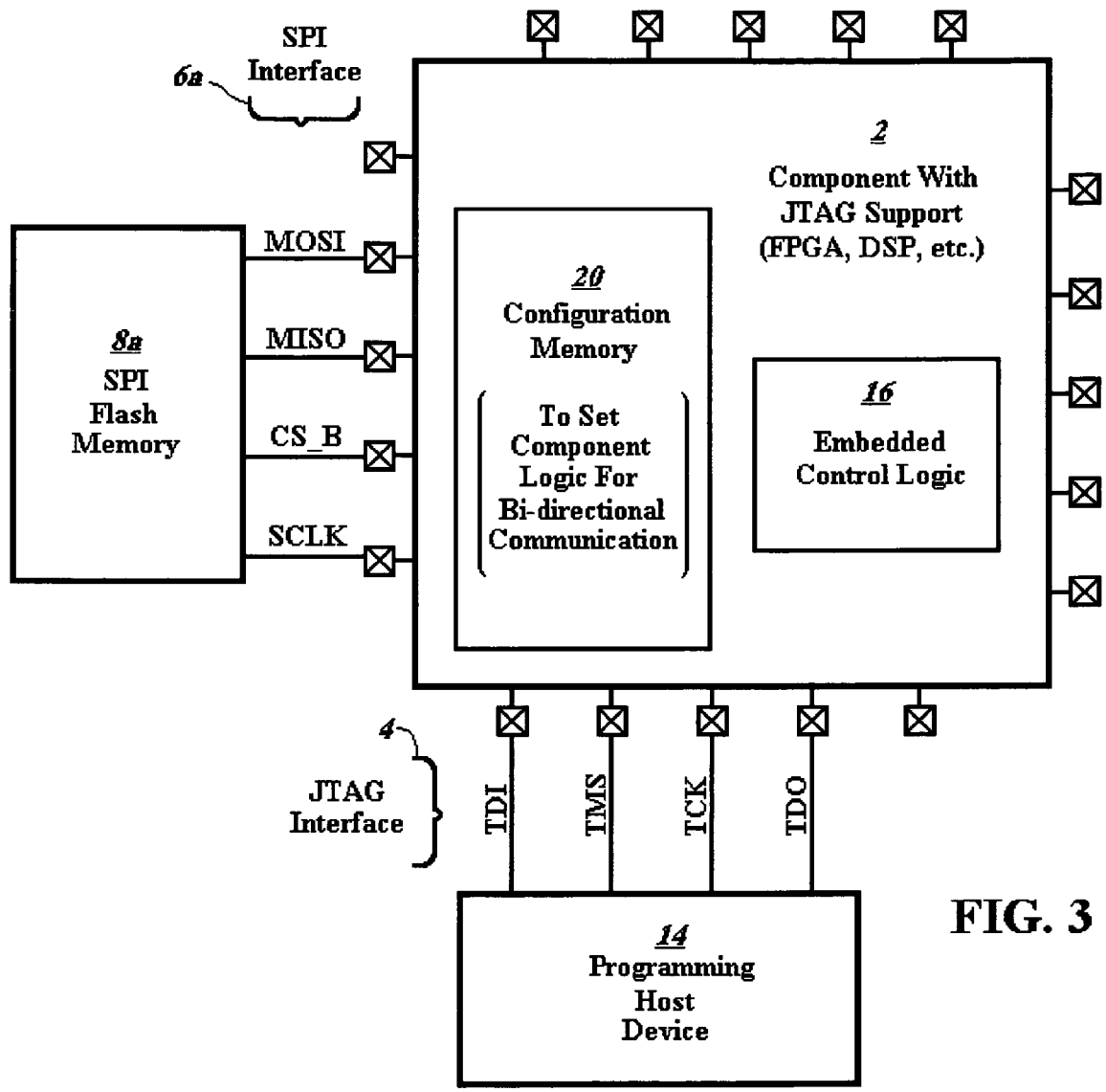
FIG. 3 illustrates a configuration of components used for programming a SPI flash memory according to embodiments of the present invention.

The fourth method of using an FPGA programming approach to program SPI flash is described with respect to a configuration of components for the method shown in FIG. 3. Before attempting to program the SPI serial flash 8a, the host programming device 14 or embedded control logic 16 is used to determine which specific memory part 8a is attached so that an appropriate programmer can be configured. Alternatively, a user might identify the specific memory device 8a attached via communications from the host programming device 14. Once selected, a user or programming device can perform a simple check to ensure that the specified memory device 8a is indeed the one connected to the FPGA 2. Alternatively, the programmer could issue various SPI commands and observe the results to determine the attached memory device 8a, as described in application Ser. No. 10/810,032 referenced previously.

Once the attached memory device 8a is identified, the programming process begins. The FPGA configuration memory 20 is initially programmed through the JTAG communication port 4 by the host programming device 14. After the FPGA 2 is configured, the FPGA configuration logic essentially becomes an SPI serial flash programmer. The host programming device 14 then provides the contents to be programmed into the attached memory device 8a via the JTAG-based serial communications port that includes JTAG port 4 and SPI interface 6a. Likewise, the FPGA is able to communicate status to the intelligent host via the JTAG and SPI based channel. The host device 14 both writes and verifies the new data contents of the SPI flash memory 8a. Communication is made between the FPGA 2 and SPI flash 8a using the SPI interface 6a, as opposed to a JTAG interface 4, the SPI interface having dedicated I/O pins. The SPI flash memory 8a can be programmed with FPGA configuration data and user data, including such things as serial numbers, ID codes, Ethernet MAC Ids, and instruction code for an embedded controller or controllers. Once the attached SPI flash memory device 8a is programmed, the FPGA 2 is then forced to reconfigure, causing the FPGA 2 to load its configuration data from the SPI flash memory 8a.

II. Parallel Flash

An FPGA, or other device with programmable logic having a JTAG interface can besides having a dedicated SPI flash interface, have a dedicated interface for a parallel commodity memory. Like the serial SPI memory, the parallel memories typically do not have a JTAG interface. There are various methods to program these parallel flash memories in a production environment, similar to the SPI flash approaches mentioned above. However, some pre-planning is required due to the specifics of the parallel flash memory interface.

Figure 4:
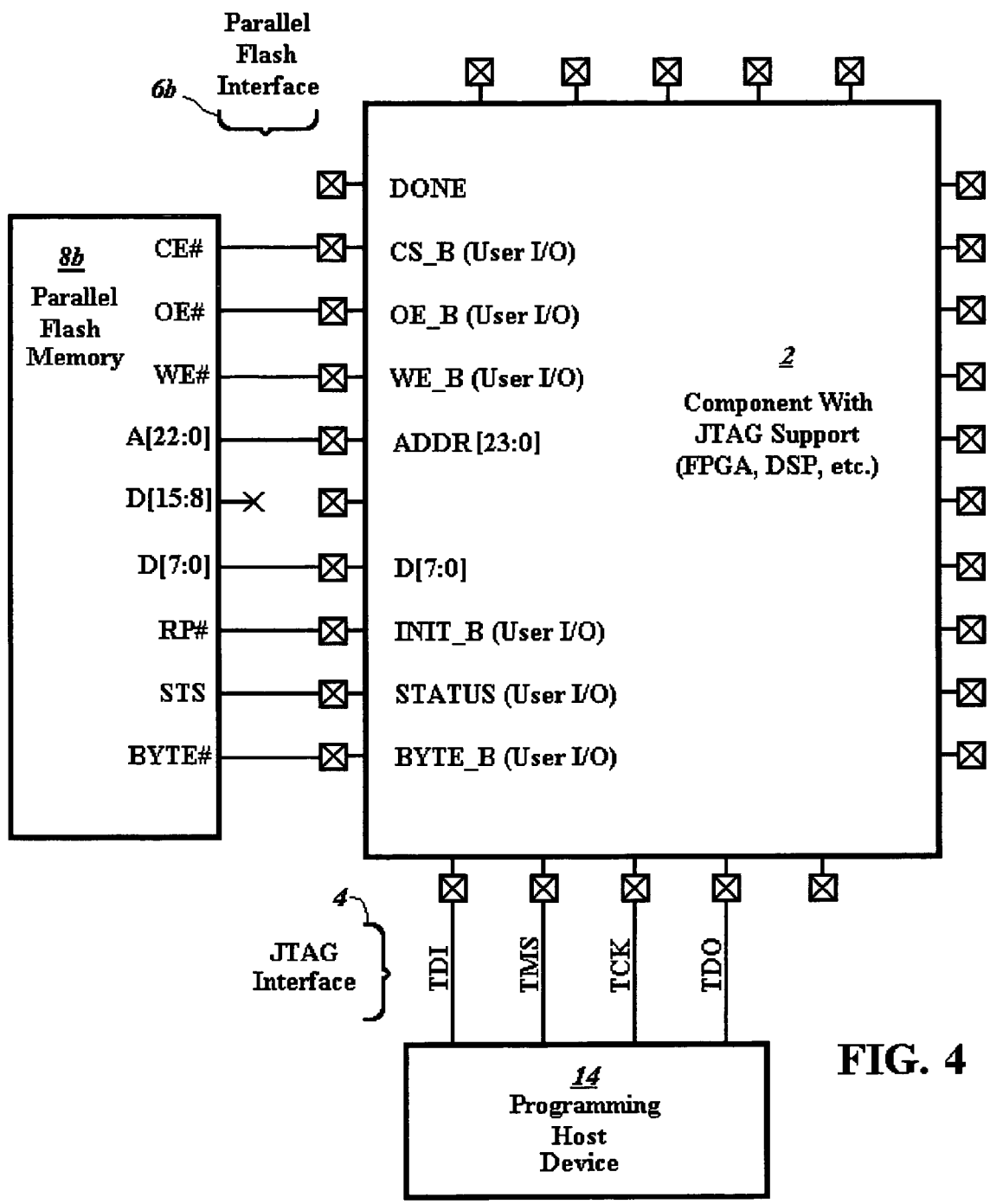
FIG. 4 illustrates a configuration of components for programming a parallel flash memory according to embodiments of the present invention.

A configuration of components for programming a parallel flash memory is illustrated in FIG. 4. The FPGA device 2 shown in FIG. 4 includes a dedicated 24-bit address bus (ADDR[23:0]) and an 8-bit data bus (D[7:0]), which connect to the corresponding pins on the attached commodity parallel memory 8b. Examples of the connected flash memory device 8b illustrated in FIG. 4 include the Intel 28F604J3 StrataFlash memory and the Micron Technology MT28F640J3.

The control inputs, CE#, OE#, and WE# of the parallel flash memory 8b can connect to pre-defined FPGA user I/O pins with appropriate pull-up or pull-down resistors, as required by a particular application. There may be further enhancements to the FPGA product definition to dedicate these pins, which would eliminate the external resistors.

In one embodiment, I/O pins would be general-purpose user-I/O, but reserved and dedicated in a data sheet to enable creating a common FPGA programming solution for variable pin definitions. The variable pins are preferably specially-designated relative to other dedicated pins as the variable pin definitions. During configuration using the FPGA programming approach described herein, the pins have a special function. After configuration, the pins become general-purpose I/O pins.

Three other parallel flash memory pins may optionally be used. In FIG. 4, the STS pin of the flash memory 8b optionally behaves like a READY/BUSY signal. If so implemented, the flash programmer downloaded via JTAG 4 and embedded within the FPGA 2 could use the READY/BUSY signal to optimize flash programming timing. However, the same function can be accomplished using software timing, eliminating the requirement for this connection.

The BYTE# signal controls whether the parallel flash memory 8b operates with a byte-wide (8 bit) or 16-bit wide data interface. The FPGA configuration logic expects a byte-wide interface. However, a user may want a 16-bit wide interface after configuration. The flash programmer downloaded into the FPGA would likely only offer byte-wide flash programming and would require access to the BYTE# signal. While a 16-bit programming interface can be used, the FPGA to flash programmer would need to know the placement of the upper 8-bits of the 16-bit data bus. If a 16-bit programming solution is desirable, the FPGA can be generally programmable as an open design so that users can assign I/O pins. For 8 bit devices, manufacturer requirements may require users to use specific pin placement for the upper 8 data bits.

Lastly, the RP# signal on the parallel flash is a reset input. If not already controlled by other logic in the system, the flash RP# signal would connect to the FPGA's INIT_B signal. During configuration, the INIT_B signal initially goes low indicating that the FPGA 2 is clearing its internal configuration registers. Likewise, the INIT_B signal would force the parallel flash into reset. The INIT_B signal then goes high, which de-asserts reset on the parallel flash. After configuration, the INIT_B pin becomes a user I/O pin and the user's application can decide how to drive the flash memory RP# signal.

Before attempting to program the byte-wide flash memory 8b, the user can determine the programming algorithm needed to instantiate into the configuration logic of the FPGA 2 for the specific parallel flash memory device 8b attached. The user might select the specific flash device 8b via the software operating on the intelligent host 14. Once selected, the programming device 14 can perform a simple check to make sure that the specified device 8b is indeed the one connected to the FPGA 2.

Once the programmer 14 determines the identity of the attached device, the programming process begins. The configuration logic of the FPGA 2 is first programmed to provide a link between its host base JTAG interface 4 and the parallel flash interface 6b. The host programmer 14 then provides the data to be programmed into the attached memory device 8b. Like the SPI flash, the parallel flash 8b can be programmed with FPGA configuration data and user data, including such things as serial numbers, ID codes, Ethernet MAC Ids, and instruction code for an embedded controller or controllers. In one embodiment, if the attached flash memory 8b supports a Common Flash Interface (CFI), then the FPGA-based flash programmer would read programming parameters directly from the parallel flash 8b and optimize the programming timing. If needed, the FPGA 2 can communicate status of the programming process to the intelligent host 14 via the JTAG-based serial channel. Once the programmer 14 writes and verifies the new contents to the parallel flash memory 8b, then the FPGA 2 can be forced to reconfigure, causing the FPGA 2 to load its configuration data from the parallel flash memory 8b. This may be performed from within the FPGA 2 using a JTAG JPROG_B command.

III. Other Components

Customers would find the essence of this approach useful for other memory devices connected to the FPGA. For example, the customer could test an attached SRAM memory via JTAG. The required JTAG bandwidth, after the initial download to instantiate the FPGA could be reduced to almost zero with SRAM memory since downloading configuration data is unnecessary. The FPGA could pass only "pass" or "fail" information back to the host programming device.

The methods in accordance with embodiments of the present invention could be applied to FPGAs that do not have dedicated memory connections, such as for SPI or parallel flash, by dedicating specific user-I/O pins and connecting them in parallel with an associated dedicated configuration pin. For example, in some FPGA devices, CCLK is a dedicated signal and is not available to the FPGA application after configuration. However, a user-I/O pin can be connected in parallel with CCLK and toggled by the user application on the configured FPGA to program an external memory device.

In one embodiment, as opposed to a JTAG interface, another type interface is used to load the configuration data. For example, a first Ethernet port or USB port can provide the interface for downloading configuration data into an FPGA, with a memory device attached to the FPGA by a second different type port. The configuration logic is set by the downloaded data so that the FPGA provides an interface between the first port and a second port connected to the memory. The JTAG port is, thus, only one example of a mode where configuration data can be downloaded into the FPGA. The FPGA can also include other downloaded or "slave" configuration methods for other port types.

For convenience if a memory device has a limited size and the programmer loaded into the memory device is implemented using an embedded processor executing from block RAM that exceeds the size of the available block RAM, then the program could be partitioned into overlays that are downloaded to the FPGA's block RAM via JTAG.

During the programming cycle for some devices it may be desirable to have a consistently available clock source. One option is to use a clock derived from the JTAG TCK clock input. The JTAG TCK input is available on a number of FPGAs, including Xilinx FPGAs architectures, via one of the user clock outputs on the BSCAN boundary scan primitive. Another option would be to use an internal oscillator source with a known output frequency. In either case, the FPGA-based configuration logic programmer should be flexible enough to optimize programming time based on the available clock source.

Although the present invention has been described above with particularity, this was merely to teach one of ordinary skill in the art how to make and use the invention. Many additional modifications will fall within the scope of the invention, as that scope is defined by the following claims.

What is claimed is:

1. A method for programming a memory device, the method comprising:
    configuring configurable logic of a component to form a configured non-JTAG interface to enable programming of the memory device, configuration being performed by providing configuration data through a JTAG interface to the component;
    wherein the configuring includes inputting the configuration data from a host device other than the memory device, and the configured non-JTAG interface on the component is coupled to the memory device via a non-JTAG interface;
    programming the memory device using the configured non-JTAG interface configured into the component by providing data through the JTAG interface and the configured non-JTAG interface to the non-JTAG interface of the memory device; and
    wherein the programming includes inputting the data from the host device to the configured non-JTAG interface via the JTAG interface and outputting the data from the configured non-JTAG interface to the memory device via the non-JTAG interface.

2. The method of claim 1, wherein the memory device comprises flash memory.

3. The method of claim 1 wherein the memory device comprises a Serial Peripheral Interface (SPI) flash memory.

4. The method of claim 1, wherein the memory device comprises parallel flash memory.

5. The method of claim 1, wherein the configured non-JTAG interface configured into the configurable logic provides a serial data link between an external source of programming data and the memory device.

6. The method of claim 1, wherein the configured non-JTAG interface controls timing and protocol to program the memory device.

7. The method of claim 1, further comprising reconfiguring the configurable logic of the component after programming of the memory device using the data stored in the memory device.

8. The method of claim 1, wherein the component comprises a Programmable Logic Device (PLD).

9. The method of claim 1, further comprising identifying the memory device, and configuring the configurable logic based on protocol required to program the memory device.

10. The method of claim 1, wherein the I/O pins of the component with configurable logic are not initially dedicated for the non-JTAG interface, and are dedicated during configuring of a field programmable gate array (FPGA).

11. The method of claim 1, wherein the memory device is provided as a separate integrated circuit component from the component with programmable logic.

12. A system for programming a memory device comprising:
a component with configurable logic having a JTAG interface port and a configured non-JTAG interface for connecting to a non-JTAG port of the memory device; and
a host processor coupled to the JTAG interface port, wherein the host processor is configured to provide signals through the JTAG interface port to program the configurable logic to form the configured non-JTAG interface, and is further configured to provide input data to the configured non-JTAG interface via the JTAG interface port to program the memory device via the non-JTAG port of the memory device after the configurable logic is configured to form the configured non-JTAG interface.

13. The system of claim 12, wherein the configured non-JTAG interface is a serial interface.

14. The system of claim 12, wherein pins of the component forming the configured non-JTAG interface for connecting to the memory device are dedicated for forming the interface to the memory device by the configuration logic provided to the component.

15. The system of claim 12, wherein the memory device comprises a flash memory.

16. The system of claim 12, wherein the component comprises a Field Programmable Gate Array (FPGA).

17. A system comprising:
a data storage means;
an interface means having configurable logic and a first interface port, wherein the configurable logic is configured to form a configured non-JTAG interface for connecting between the first interface port and the data storage means;
wherein the first interface port comprises a JTAG port;
a host means connected to the first interface port of the interface means for providing signals through the first interface port to program the configurable logic of the interface means to form the configured non-JTAG interface and for providing signals through the first interface port to the configured non-JTAG interface for storing data from the host means to the data storage means; and
wherein the data storage means and the host means are external to the interface means.

18. The system of claim 17, wherein the interface means comprises an FPGA.

19. The system of claim 17, wherein the host means comprises a general user interface processor.

20. The system of claim 17, wherein the data storage means comprises a flash memory.

* * * * *